United States Patent [19]

Gazsi

[11] Patent Number: 5,233,550
[45] Date of Patent: Aug. 3, 1993

[54] ADAPTIVE BALANCE FILTER

[75] Inventor: Lajos Gazsi, Düsseldorf, Fed. Rep. of Germany

[73] Assignee: Siemens Aktiengesellschaft, Munich, Fed. Rep. of Germany

[21] Appl. No.: 807,167

[22] Filed: Dec. 13, 1991

[30] Foreign Application Priority Data

Dec. 17, 1990 [EP] European Pat. Off. ......... 90124441.8

[51] Int. Cl.⁵ .............................................. G06F 15/31
[52] U.S. Cl. ................................................. 364/724.19
[58] Field of Search ...................... 364/724.19, 724.01

[56] References Cited

U.S. PATENT DOCUMENTS 5,130,943  7/1992  Gazsi et al. ................... 364/724.19

Primary Examiner—Long T. Nguyen
Attorney, Agent, or Firm—Herbert L. Lerner; Laurence A. Greenberg

[57] ABSTRACT

In an adaptive balance filter, the coefficients of an adaptive filter are only taken over in a shadow filter, when a digital input signal to be transmitted is recognized as a wide band signal.

8 Claims, 1 Drawing Sheet

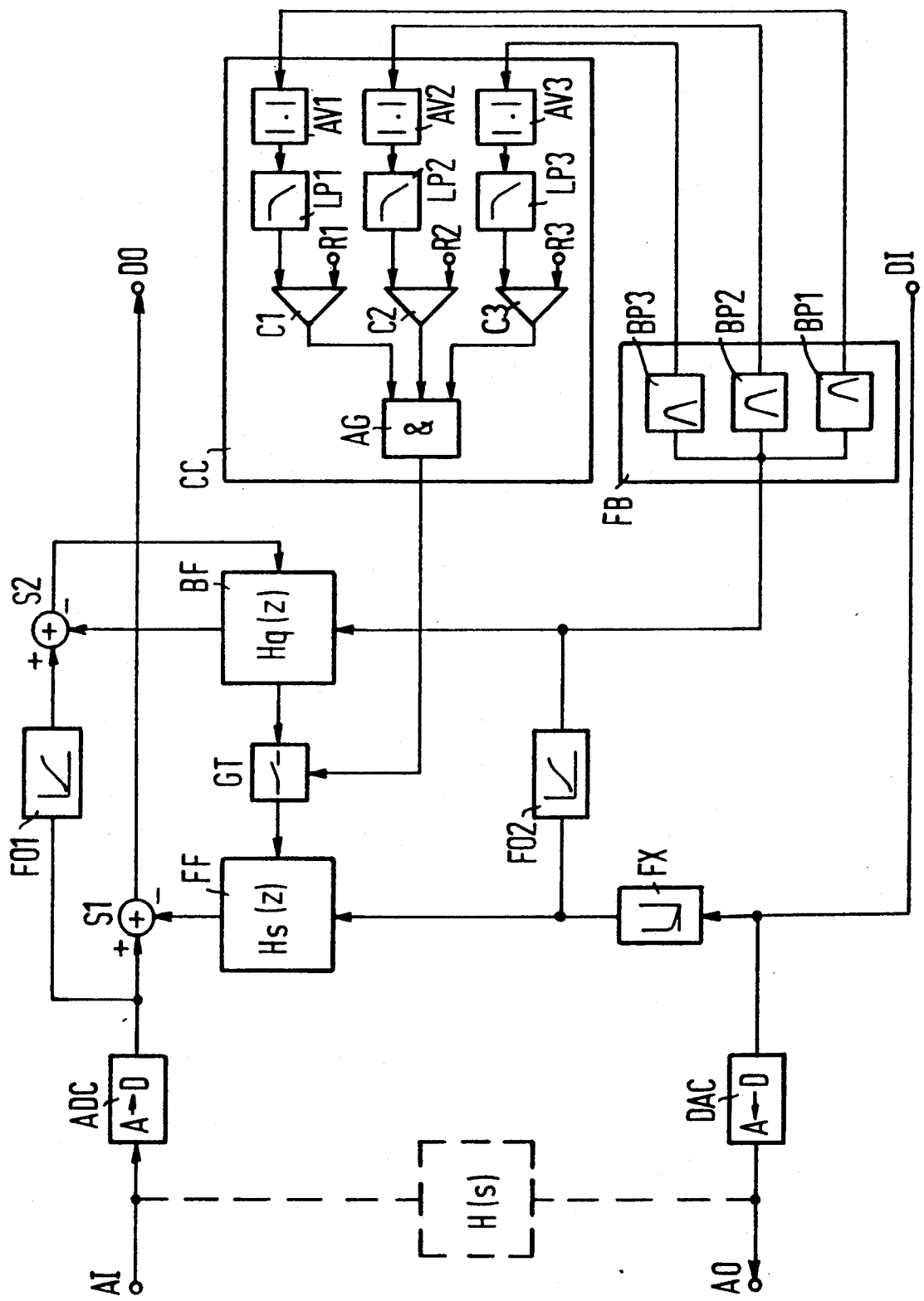

ADAPTIVE BALANCE FILTER

BACKGROUND OF THE INVENTION

The invention relates to an adaptive balance filter.

One substantial problem in digital communications systems is duplexing, that is simultaneous transmission and reception at high data rates over existing two-wire lines. Difficulties arise due to crosstalk from the analog transmission route to the analog reception route, above all in dividing the two-wire lines into transmission and reception routes. Instead of the previously typical analog hybrid network technology, a method generally known as digital echo suppression has gained wide use, especially in public systems with ranges of about 8 km. The assumption is that crosstalk can be described by a transfer function of the echo path, corresponding to a filter between the transmission and reception routes. For echo suppression, a so-called balance filter is incorporated between the transmission and reception routes, which has a transfer function that is inverse to the echo path.

Such a balance filter is known, for instance, from a paper by S. J. Poole, G. Surace, B. Singh and N. P. Dyer, entitled A CMOS Subscriber Line Audio Processing Circuit Including Adaptive Balance, from the International Symposium on Circuits and Systems, Helsinki, June 7-9, 1988, pp. 1931-1934 in particular FIG. 4. That balance filter is constructed as an adaptive filter. In other words, the balance filter adapts to various or varying transfer functions of the echo path. In order to set the inverse transfer function, the coefficients of the balance filter are varied so that an error signal, which is formed in accordance with certain criteria, is minimized. The known adaptive balance filter includes, among other elements, an adaptive filter (background filter), which ascertains the optimal filter coefficients from the error signal, and a shadow filter (foreground filter) with fixed filter coefficients. The filter coefficients of the shadow filter are set equal to the filter coefficients of the adaptive filter, under a certain condition. The condition for adoption of the filter coefficients is that over a given relatively long period of observation, the error of the adaptive filter is less than the error of the shadow filter. If a transition signal is missing adaptation is in fact virtually impossible, and the transfer function of the adaptive filter therefore involves major error. In such a state, the most recently set transmission behavior of the shadow filter is therefore kept constant, that is no filter coefficients are adopted.

Duplexing with narrow band signals is still problematic, which is true for data transmission by modem, for instance. On one hand, adaptation of the adaptive filter with narrow band signals is very difficult and entails major error. On the other hand, adoption of the flawed coefficient of the adaptive filter by the shadow filter takes place continuously, because initially the shadow filter has a greater error than the adaptive filter. However, since both the adaptive filter and thus the shadow filter involve major error, adequate echo suppression is not possible, and that in turn can lead to interference in data transmission.

SUMMARY OF THE INVENTION

It is accordingly an object of the invention to provide an adaptive balance filter, which overcomes the hereinaforementioned disadvantages of the heretofore-known devices of this general type.

With the foregoing and other objects in view there is provided, in accordance with the invention, an adaptive balance filter, comprising a digital/analog converter having an input receiving a digital input signal and an output supplying an analog output signal; a filter bank having an input receiving the digital input signal and having more than two outputs, each being assigned to one respective frequency range; an evaluation circuit having inputs each being connected to a respective one of the outputs of the filter bank and having an output supplying a control signal, if certain minimum energies in each frequency range are exceeded; an adaptive filter having a signal output and a coefficient output for outputting filter coefficients, and having an error signal input and a signal input receiving or being occupied by the digital input signal; a shadow filter having a signal input receiving the digital input signal, a signal output and a coefficient input for loading the filter coefficients; an analog/digital converter having an input receiving an analog input signal and having an output; a first subtractor having a non-inverting input connected to the output of the analog/digital converter, an inverting input connected to the signal output of the shadow filter, and an output supplying a digital output signal; a second subtractor having a non-inverting input connected to the output of the analog/digital converter, an inverting input connected to the signal output of the adaptive filter, and an output connected to the error signal input of the adaptive filter; and a transfer device being connected between the coefficient output of the adaptive filter and the coefficient input of the shadow filter and having a control input connected to the output of the evaluation circuit, for transferring the filter coefficients of the adaptive filter to the shadow filter upon an occurrence of a corresponding control signal at the control input.

In accordance with another feature of the invention, there is provided a fixed filter connected to the signal input of the shadow filter, to the signal input of the adaptive filter and to the input of the filter bank.

In accordance with a further feature of the invention, there is provided a first form filter connected to the non-inverting input of the second subtractor, and a second form filter connected to the input of the filter bank and to the signal input of the adaptive filter, the first and second form filters having identical transfer behaviors. In accordance with a concomitant feature of the invention, the evaluation circuit includes value forming devices each being assigned to a respective one of the inputs of the evaluation circuit, low-pass filters each being connected downstream of a respective one of the value forming devices, comparators each being connected downstream of a respective one of the low-pass filters for comparison with a respective reference value, the comparators having outputs, and an AND gate linking the outputs of the comparators and supplying the control signal.

Other features which are considered as characteristic for the invention are set forth in the appended claims.

Although the invention is illustrated and described herein as embodied in an adaptive balance filter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The drawing is a schematic circuit diagram of an adaptive balance filter according to the invention.

DETAILED DESCRIPTION OF THE INVENTION

Referring now to the single figure of the drawing in detail, there is seen an adaptive balance filter according to the invention which includes an analog/digital converter ADC, having an input at which an analog input signal AI that is transmitted by means of a non-illustrated reception route is applied, and a digital/analog converter DAC having an input to which a digital input signal DI is applied and having an output which releases an analog output signal AO to a non-illustrated transmission route.

Both the analog/digital converter ADC and the digital/analog converter DAC include all of the devices necessary for signal conversion, such as anti-aliasing filters or devices for increasing or lowering the sampling rate. An echo path between the transmission route and the reception route can be described by a transfer function $H(s)$.

A non-inverting input of a first subtractor S1 is directly connected to an output of the analog/digital converter ADC, and a non-inverting input of a second subtractor S2 is connected to the output of the analog/digital converter ADC with the interposition of a form filter F01. An inverting input of the subtractor S1 is connected to the output of a shadow filter FF with a transfer function $Hs(z)$, and an inverting input of the subtractor S2 is connected to the output of an adaptive filter BF with a transfer function $Hq(z)$. A digital output signal DO is present at an output of the subtractor S1.

The digital input signal DI is carried not only to the digital/analog converter DAC but also to inputs of the shadow filter FF, the adaptive filter BF, and a filter bank FB. A fixed filter FX is disposed between the inputs of the shadow filter FF, the adaptive filter BF and the filter bank FB, and a further form filter F02, which is constructed identically to the form filter F01, additionally precedes the inputs of the adaptive filter BF and the filter bank FB.

The filter bank FB splits the signal applied at its input, namely the digital input signal DI carried through the fixed filter FX and the form filter F02, into subsignals assigned to three specific frequency ranges. To this end, the filter bank FB has three bandpass filters BP1-BP3. The outputs of the filter bank FB correspond to the outputs of the bandpass filters BP1-BP3, and each is connected to one input of an evaluation circuit CC If certain minimum energies in each of the frequency ranges defined by the filter bank FB are exceeded, then a control signal is present at the output of the evaluation circuit CC. To this end, the evaluation circuit CC, for instance, includes three value forming devices AV1-AV3, each of which forms the value of the corresponding output signals of the filters FB; three low-pass filters LP1-LP3 each being connected to the output side of one of the value formers AV1-AV3; and three comparators C1-C3 each being connected to the output side of one of the low-pass filters LP1-LP3, the comparators C1-C3 being additionally acted upon by identical or different reference values R1-R3; and an AND gate AG, which links the outputs of the comparators C1-C3 together and has an output at which the control signal is present. The control signal is carried to a control input of a transfer device GT connected between a coefficient output of the adaptive filter BF and a coefficient input of the shadow filter FF. Upon the appearance of the control signals, the filter coefficients of the adaptive filter BF are transmitted to the shadow filter FF.

An essential feature of the mode of operation of an adaptive balance filter according to the invention is that only the digital input signal DI is evaluated, that the evaluation is effected in at least three frequency ranges of the digital input signal DI, and that a transfer of the coefficients of the adaptive filter BF to the shadow filter FF takes place only upon the appearance of certain minimum energies in the various frequency ranges. In other words, it is only in such a case that the data of the shadow filter FF are refreshed. Otherwise, the coefficients of the shadow filter FF are kept constant until such time as a broad band digital input signal DI is again present.

In the structure according to the invention, the fixed filter FX and the two form filters F01 and F02 serve the following purposes. The form filter FX provides a constant factor, that is one that appears in all adaptation regions of the adaptive filter BF and thus of the shadow filter FF as well, for the transfer functions $Hq(z)$ and $Hs(z)$, respectively, which factors are accordingly realized separately, thus lessening the expense for the adaptive filter BF and the shadow filter FF. The form filter F02 is constructed in such a way as to exhibit the average speech spectrum, which approximates the spectrum of white noise. In other words, it behaves substantially as a high-pass filter. The result is more-uniform modulation of the circuit elements of the filter bank FB and the evaluation circuit CC assigned to the various frequency ranges. The form filter F01, which is identical to the form filter F02, serves to attain equal weighting for the adaptive filter BF of the proportion of the analog input signal AI and the proportion of the digital input signal DI, that is carried through the adaptive filter BF, when an error signal is present a the output of the subtractor S2.

Splitting the digital input signals DI into separate frequency ranges is effected by means of the filter bank FB which, for instance, includes a number of bandpass filters, that in turn are constructed as arbitrary digital filters with recursive and non-recursive structures, but in particular in the form of weighted digital filters. The evaluation of the signal energies in the various frequency ranges by the evaluation circuit CC is to be carried out, among other ways, by value formation with ensuing low-pass filtration and comparison with a given reference value. In the same way, squaring, for instance, instead of value formation, is also possible. The reference values are then set in such a way that adoption of the coefficients by the shadow filter FF occurs only whenever the energy, in the period of observation defined by the time constants of the low-pass filters, was adequate for exact adaptation of the adaptive filter BF. The reference values may be either different from one another or identical, and moreover can be kept constant or may, for instance, be variable by external programming. The accuracy of the filter bank FB and the evaluation circuit CC can be increased further by increasing the number of frequency ranges. However, a split into three frequency ranges, that is one range each for low, middle and higher frequencies, is entirely adequate for most applications, particularly in the telephone field. An adaptive balance filter according to the invention is thus particularly well suited for operation with narrow band signals and for duplexing, and in particular with narrow band signals in duplexing.

In closing, it should be noted that if a test signal corresponding to white noise is supplied as a digital input signal DI, then the two form filters F01 and F02 are naturally to be bypassed.

I claim:

1. An adaptive balance filter, comprising:
    a digital/analog converter having an input receiving a digital input signal and an output supplying an analog output signal;
    an input receiving the digital input a filter bank having signal and having more than two outputs, each being assigned to one respective frequency range;
    an evaluation circuit having inputs each being connected to a respective one of the outputs of said filter bank and having an output supplying a control signal, if certain minimum energies in each frequency range are exceeded;
    an adaptive filter having a signal output and a coefficient output for outputting filter coefficients, and having an error signal input and a signal input receiving the digital input signal;
    a shadow filter having a signal input receiving the digital input signal, a signal output and a coefficient input for loading the filter coefficients;
    an analog/digital converter having an input receiving an analog input signal and having an output;
    a first subtractor having a non-inverting input connected to the output of said analog/digital converter, an inverting input connected to the signal output of said shadow filter, and an output supplying a digital output signal;
    a second subtractor having a non-inverting input connected to the output of said analog/digital converter, an inverting input connected to the signal output of said adaptive filter, and an output connected to the error signal input of said adaptive filter; and
    a transfer device being connected between the coefficient output of said adaptive filter and the coefficient input of said shadow filter and having a control input connected to the output of said evaluation circuit, for transferring the filter coefficients of said adaptive filter to said shadow filter upon an occurrence of a corresponding control signal at the control input.

2. The adaptive balance filter according to claim 1, including a fixed filter connected to the signal input of said shadow filter, to the signal input of said adaptive filter and to the input of said filter bank.

3. The adaptive balance filter according to claim 2, including a first form filter connected to the non-inverting input of said second subtractor, and a second form filter connected to the input of said filter bank and to the signal input of said adaptive filter, said first and second form filters having identical transfer behaviors.

4. The adaptive balance filter according to claim 3, wherein said evaluation circuit includes value forming devices each being assigned to a respective one of the inputs of said evaluation circuit, low-pass filters each being connected downstream of a respective one of said value forming devices, comparators each being connected downstream of a respective one of said low-pass filters for comparison with a respective reference value, said comparators having outputs, and an AND gate linking the outputs of said comparators and supplying the control signal.

5. The adaptive balance filter according to claim 2, wherein said evaluation circuit includes value forming devices each being assigned to a respective one of the inputs of said evaluation circuit, low-pass filters each being connected downstream of a respective one of said value forming devices, comparators each being connected downstream of a respective one of said low-pass filters for comparison with a respective reference value, said comparators having outputs, and an AND gate linking the outputs of said comparators and supplying the control signal.

6. The adaptive balance filter according to claim 1, including a first form filter connected to the non-inverting input of said second substractor, and a second form filter connected to the input of said filter bank and to the signal input of said adaptive filter, said first and second form filters having identical transfer behaviors.

7. The adaptive balance filter according to claim 6, wherein said evaluation circuit includes value forming devices each being assigned to a respective one of the inputs of said evaluation circuit, low-pass filters each being connected downstream of a respective one of said value forming devices, comparators each being connected downstream of a respective one of said low-pass filters for comparison with a respective reference value, said comparators having outputs, and an AND gate linking the outputs of said comparators and supplying the control signal.

8. The adaptive balance filter according to claim 1, wherein said evaluation circuit includes value forming devices each being assigned to a respective one of the inputs of said evaluation circuit, low-pass filters each being connected downstream of a respective one of said value forming devices, comparators each being connected downstream of a respective one of said low-pass filters for comparison with a respective reference value, said comparators having outputs, and an AND gate linking the outputs of said comparators and supplying the control signal.

* * * * *